(12) United States Patent
Carlson et al.

(10) Patent No.: US 7,434,151 B2
(45) Date of Patent: Oct. 7, 2008

(54) READ CONTROL SYSTEMS AND METHODS

(75) Inventors: Richard Lawrence Carlson, Fort Collins, CO (US); Charles Regis Morganti, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 671 days.

(21) Appl. No.: 10/954,700

(22) Filed: Sep. 30, 2004

(65) Prior Publication Data

US 2006/0075313 A1 Apr. 6, 2006

(51) Int. Cl.
*G06F 11/00* (2006.01)

(52) U.S. Cl. .................. 714/819; 714/718; 714/719

(58) Field of Classification Search .......... 714/719, 714/739, 718
See application file for complete search history.

(56) References Cited

U.S. PATENT DOCUMENTS

| | | | |
|---|---|---|---|
| 4,652,993 A * | 3/1987 | Scheuneman et al. ....... 711/151 |
| 5,300,811 A | 4/1994 | Suzuki et al. | |
| 5,423,009 A | 6/1995 | Zhu | |
| 5,515,507 A | 5/1996 | Byers et al. | |
| 5,603,041 A | 2/1997 | Carpenter et al. | |
| 5,633,605 A | 5/1997 | Zimmerman et al. | |
| 5,703,501 A | 12/1997 | Geisler | |
| 6,119,249 A * | 9/2000 | Landry ................ | 714/718 |
| 6,141,271 A | 10/2000 | Yoon et al. | |
| 6,185,703 B1 | 2/2001 | Guddat et al. | |
| 6,226,764 B1 | 5/2001 | Lee | |
| 6,249,893 B1 | 6/2001 | Rajsuman et al. | |
| 6,295,618 B1 | 9/2001 | Keeth | |
| 6,430,194 B1 * | 8/2002 | Ilyadis et al. ............. | 370/462 |
| 2005/0071531 A1 * | 3/2005 | Oshins ................. | 710/260 |

OTHER PUBLICATIONS

GB Search Report dated Nov. 10, 2005.

* cited by examiner

*Primary Examiner*—Jacques Louis-Jacques
*Assistant Examiner*—Sam Rizk

(57) ABSTRACT

A read control system and method for a memory device are provided. One embodiment of a system, among others, includes dump logic coupled to a data source, said dump logic configured to receive a first group of a defined slice of data and a second group of the defined slice of data; and a true dump bus and a complement dump bus configured in a wired-OR arrangement, said dump logic configured to drive the first group of data onto the true dump bus and the second group of data onto the complement dump bus.

33 Claims, 5 Drawing Sheets

READ CONTROL SYSTEMS AND METHODS

BACKGROUND

Integrated circuit memory devices are widely used in consumer and commercial electronics. Integrated circuit memory devices generally include a memory cell array and peripheral circuits for reading data from and writing data to a memory cell array. During and/or as a result of the fabrication process, faults in memory cells of a memory array may occur, including complete failure of the memory cells, failure of particular cells, and failure only under limited circumstances.

Various test mechanisms have been devised to search for and/or identify these and other faults. One known mechanism is a direct access test (DAT), in which the memory allows external test circuitry to directly read from and write to specific memory cells. A direct access test can be implemented by writing data test patterns to memory cells and then reading from the same memory cells. The data written to the memory cells is compared to the data read back to determine the condition of the memory cells. A difference between the data test pattern written to the cells versus the data test pattern read from the cells may indicate a faulty cell(s), which may prompt an alert indicating a failure. Such an alert may be in the form of a single bit indication (e.g., "0" signifies a failure, "1" signifies a "pass" condition).

If the contents of a memory array (or cache or other wide data source) are to be read out, such as for diagnostic purposes or for DAT purposes, a problem often encountered with such operations is that the width of the data path available for these test read operations is smaller than the width of the data stored and read out by the memory array. For example, a memory array read operation may be accomplished using 1024 bits per access, but use a test data path of only 64 bits wide. One solution to this problem may be to multiplex the memory array down onto a narrow test bus. That is, control signals can be used to select one of several slices (e.g., units of data) of the memory array to place on the narrow test bus. One problem with this solution includes the complexity in wiring needed to distribute and route the memory array wires across an array of multipexers. Another problem includes providing a non-intuitive allocation of bits to the various slices (e.g., having adjacent bits in the memory array being split apart and distributed among different slices). Adding to the above described problems is the excessive time and/or circuitry needed to check the value of each slice independently or all slices concurrently.

Some solutions have been introduced to help alleviate some of the problems associated with multiplexing the memory array down onto a narrow test bus. One solution is to conditionally drive the slices of the memory array onto a distributed wired-OR, precharged dynamic bus. For a typical static signal, transistors may pull the signal high (e.g., to $V_{source}$) for a complete clock cycle or low (e.g., to ground) for a complete clock cycle depending on what information is to be placed on a bus. In contrast, a dynamic bus implementation may utilize a precharge device that always pulls the signal high (or low) during the first half of the clock cycle. During the second half of the clock cycle, a transistor may be conditionally turned on, causing the signal to either remain at the current state or change state. A dynamic bus enables a wired-OR bus configuration (unlike static signal designs). With a wired-OR configuration, control signals can select one of several slices of the memory array to be able to discharge the dynamic bus. Further, a dynamic bus can be discharged at any physical location along the dynamic bus. Thus, a conventional dynamic bus enables the collection of data from various slices of an array entry without any explicit multiplexers or the associated wiring congestion. However, a conventional dynamic bus still has disadvantages. For example, DAT testing typically checks the value of each slice independently, which consumes time.

SUMMARY

One embodiment of a read control method includes dividing data from a data source into defined slices, subdividing the defined slices into a first group and a second group, and driving the first group onto a first bus and the second group onto a second bus, the second bus providing data that is inverted as compared to the data on the first bus, the first bus and the second bus configured to provide wired-OR functionality.

One embodiment of a read control system includes dump logic coupled to a data source, said dump logic configured to receive a first group of a defined slice of data and a second group of the defined slice of data; and a true dump bus and a complement dump bus configured in a wired-OR arrangement, said dump logic configured to drive the first group of data onto the true dump bus and the second group of data onto the complement dump bus.

One embodiment of a read control system includes means for dividing defined slices of data from a data source into a first group and a second group, and means for driving the first group onto a first bus and the second group onto a second bus, the second bus providing data that is inverted as compared to the data on the first bus, the first bus and the second bus configured to provide wired-OR functionality.

BRIEF DESCRIPTION OF THE DRAWINGS

The components in the drawings are not necessarily to scale, emphasis instead being placed upon clearly illustrating the principles of the disclosed systems and methods. Moreover, in the drawings, like reference numerals designate corresponding parts throughout the several views.

DETAILED DESCRIPTION

Figure 1:
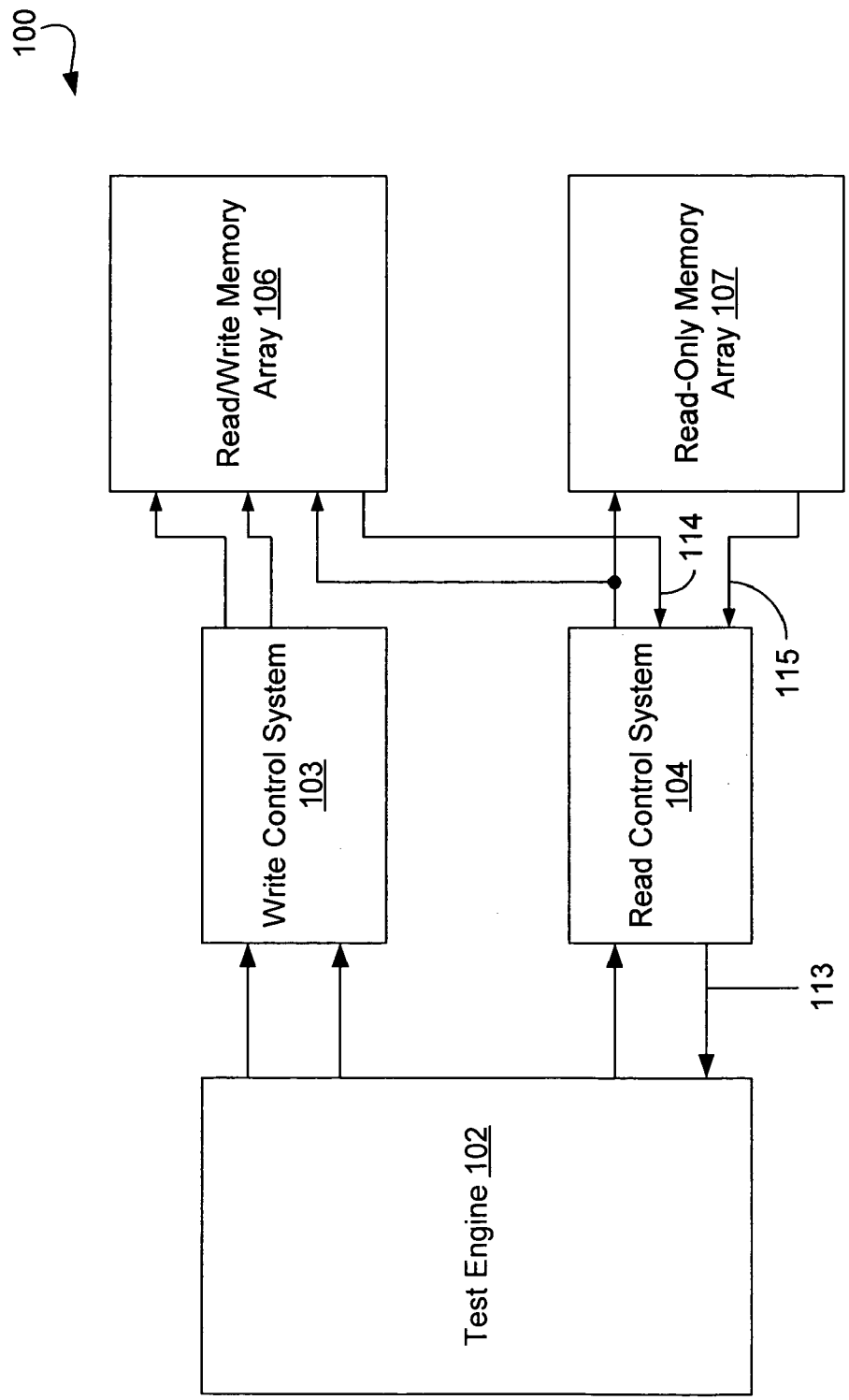
FIG. 1 is a schematic diagram of an example implementation for a memory test system in which various embodiments of a read control system can be implemented.

Disclosed herein are various embodiments of a read control system and method (herein read control system for brevity). The read control system controls direct access testing on, and individual diagnostic reads from, a memory array of x-bits in width using a y-bit data path, where y is less than x. Note that architectures in which y is equal to or greater than x may similarly benefit from the mechanisms of the read control system. The read control system is an extension of a wired-OR/dynamic bus configuration in which all bits of a wide data source can be tested to provide a pass/fail indication on a narrow bus back to a test engine. However, the read control system improves upon the dynamic bus solution in a way that also enables DAT (direct access test) testing to include the checking of an entire wide data source simultaneously, using only a small amount of comparison logic that is independent of the number of bits in the wide data source. In general, the comparison logic checks for correctness of the data source by comparing all slices from the data source, which are known to contain identical data if the memory array is working correctly. As is described below, the comparison logic checks for correctness without having to know what the correct data should be. One method employed by the read control system relies on the assumption that DAT testing typically replicates the same data testing patterns across multiple slices of the data source. Instead of a single dynamic bus to collect data from the various slices, the read control system implements two sets of dump buses. In one embodiment, the two sets of dump buses are configured as dynamic buses. The dump buses include one set of true dynamic buses and one set of complement dynamic buses, all of equal width, and typically as wide as a data testing pattern. Note that if there is more than one bus in a set, the buses can collect data from different subsets of slices and feed into a final bus of the set, which represents all of the slices (e.g., such as to reduce loading on each individual bus as explained below). The true and complement dynamic buses are all dynamic wired-OR buses, precharged to a precharge state during a first phase of a clock period, and conditionally discharged to a discharge state during the other phase of the clock period. The precharge state, as used herein, will be represented using a logical "1" state, and the discharge state will be represented using a logical "0" state. Note that the logical representations for these states can be reversed.

An alternative embodiment using dump buses configured as static wired-OR buses is also possible. In such embodiments, a pull-up device may pull the dump buses to the precharge state, but one or more discharge devices may be able to override the pull-up device and set the dump bus in the discharge state. Thus, although dump buses for the read control system will be described using a wired-OR dynamic bus configuration, dump buses can also be configured as a wired-OR static bus configuration.

Figure 2:
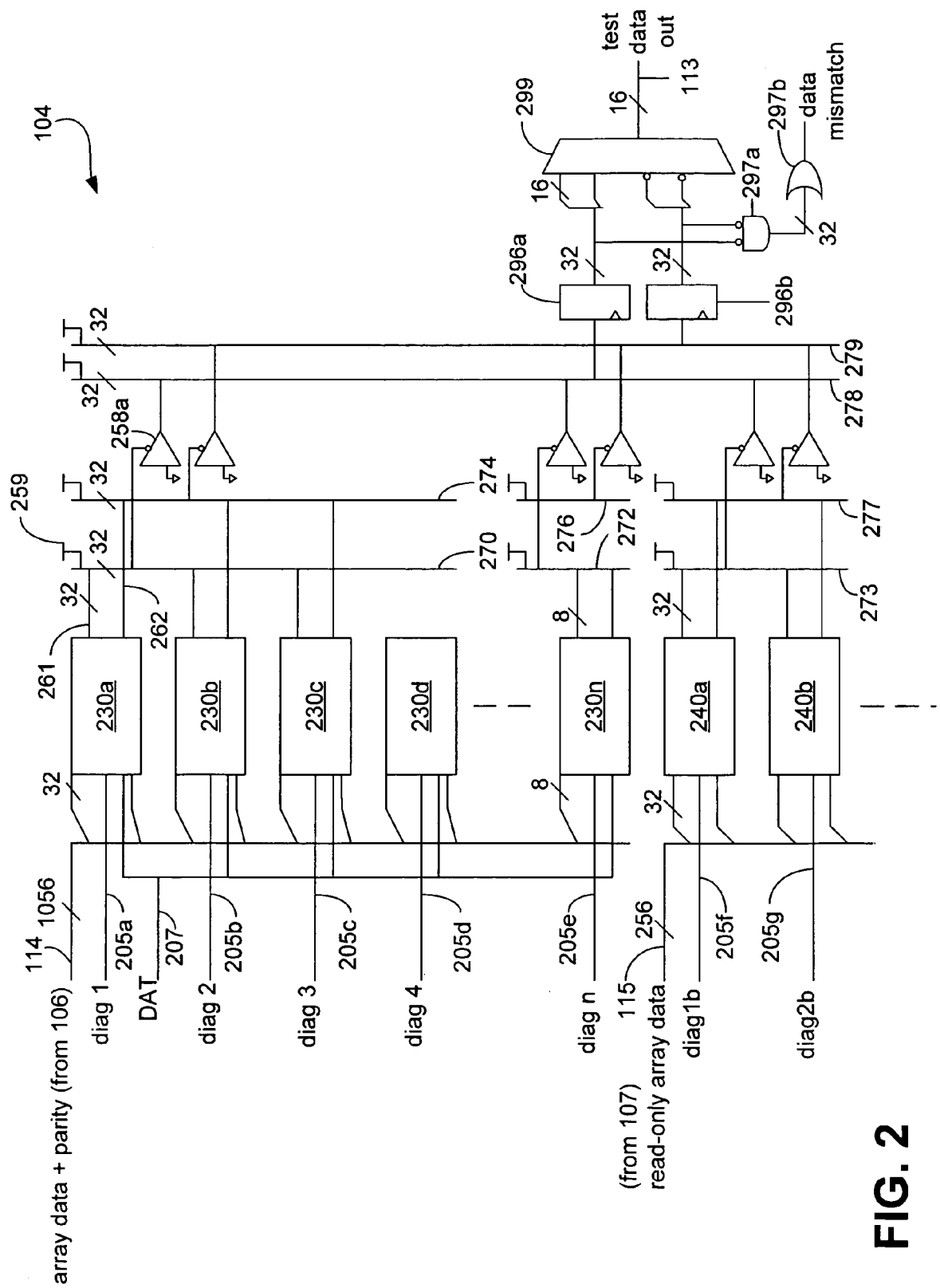
FIG. 2 is a schematic diagram of an embodiment of the read control system shown in FIG. 1.
Figure 3:
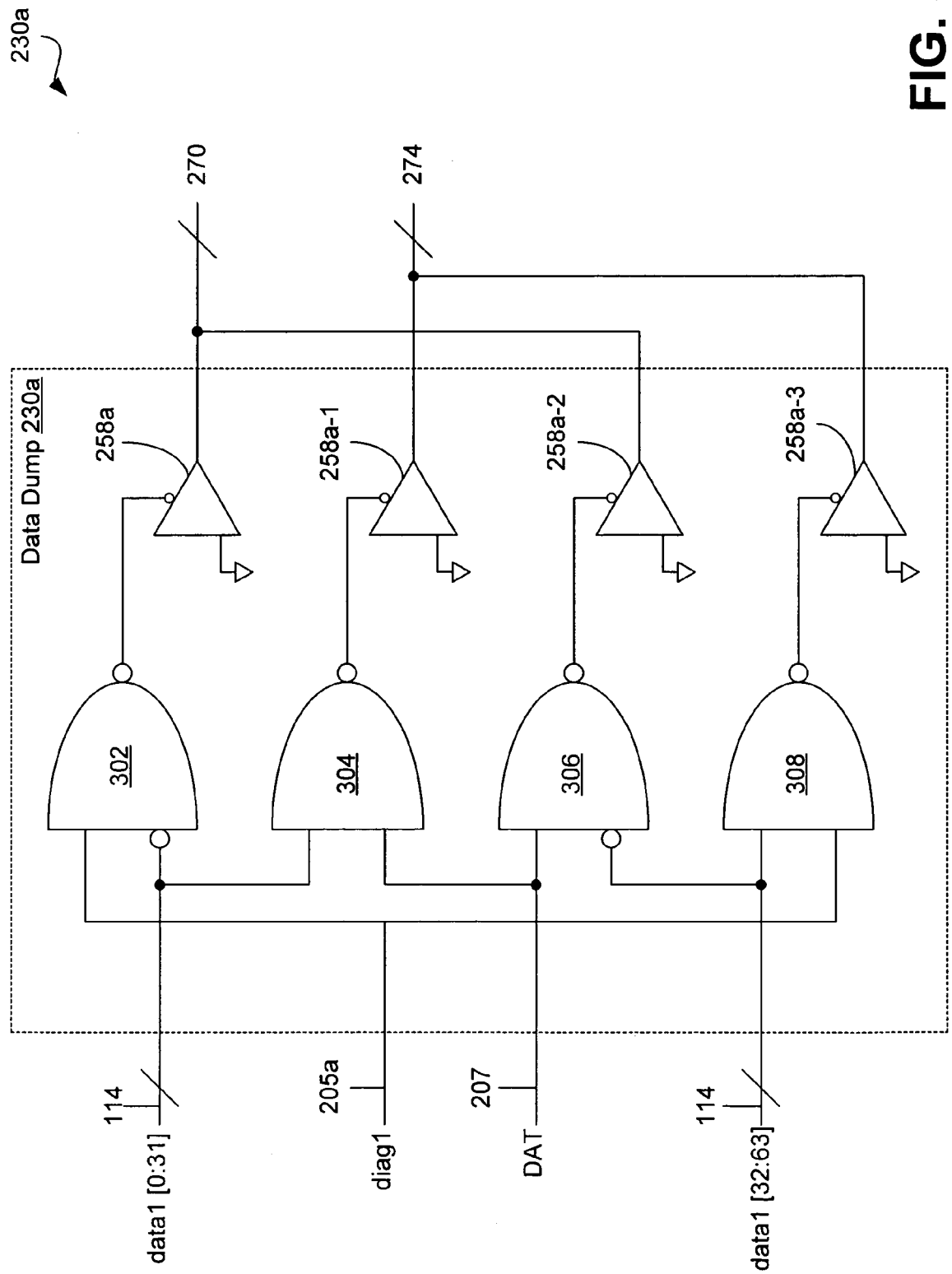
FIG. 3 is a schematic diagram of an exemplary data dump of the read control system shown in FIG. 2.
Figure 4:
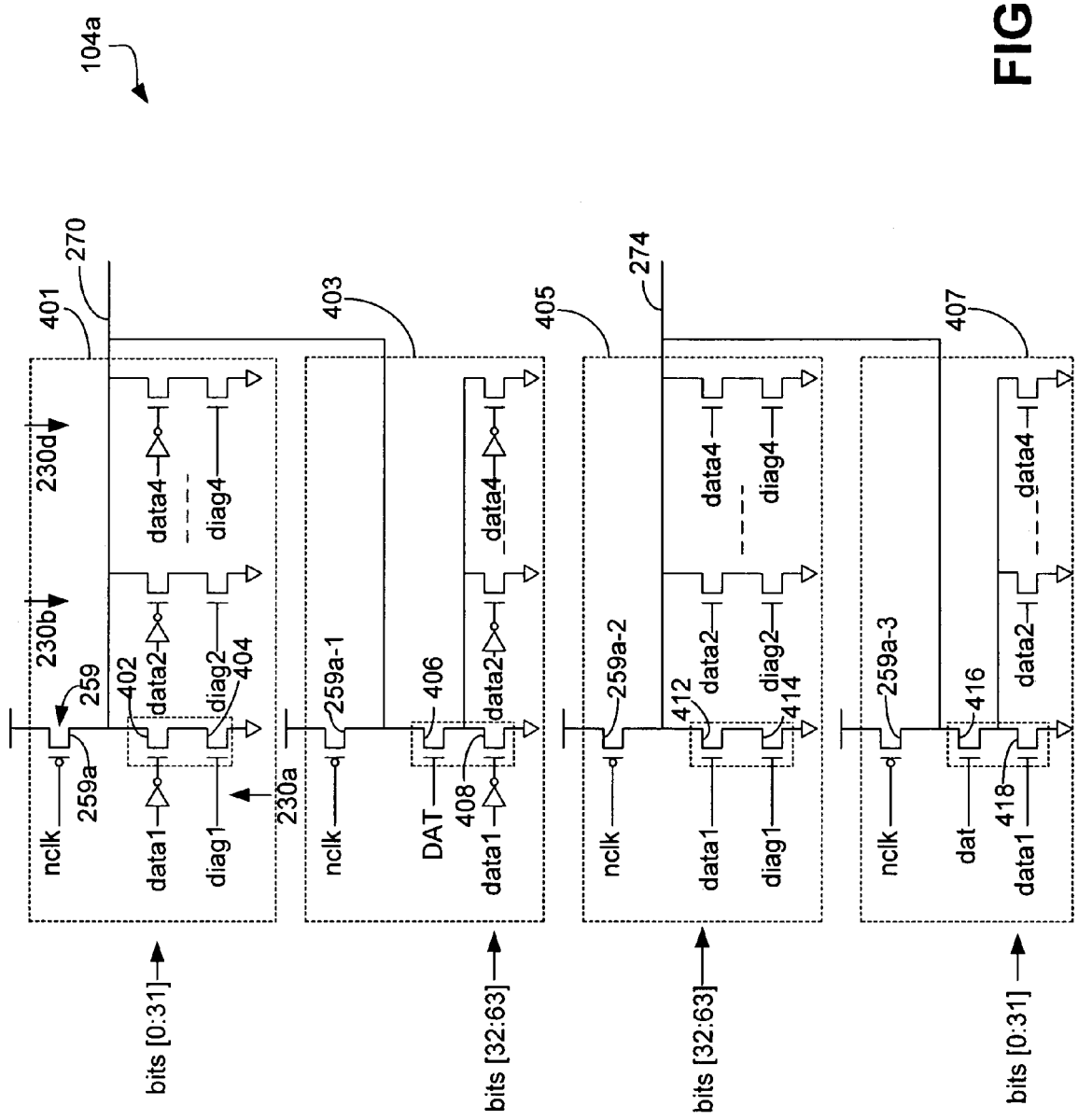
FIG. 4 is a schematic diagram that provides an embodiment of an equivalent transistor arrangement of the read control system shown in FIG. 2.
Figure 5:
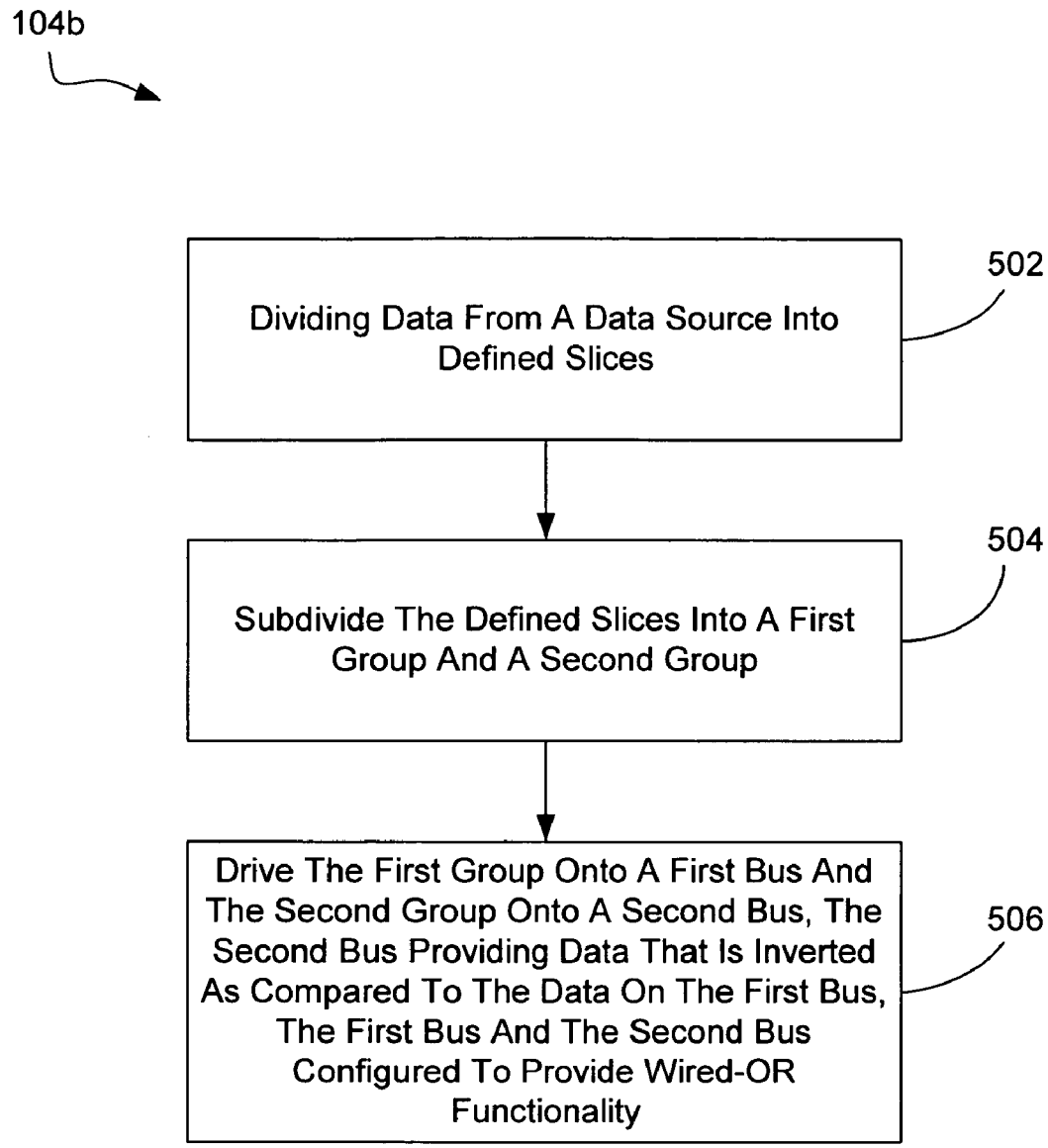
FIG. 5 is a flow diagram of a read control method embodiment corresponding to the read control system embodiment shown in FIG. 2.

An example implementation for a read control system is generally described in association with FIG. 1. Although described in the context of DAT testing, the read control system also permits diagnostic accesses to read individual sections of the wide data source. An illustration of various embodiments of the read control system of FIG. 1 and corresponding components is shown in FIGS. 2-4. FIG. 5 is an illustration of a read control method embodiment.

FIG. 1 illustrates an example memory test system 100, which shows an embodiment of a read control system 104 as used in a DAT testing implementation. The memory test system 100 can be integrated onto a single device (e.g., an application specific integrated circuit (ASIC) for a microprocessor or system-on-chip (SOC)), or distributed among two or more devices. The memory test system 100 includes a test engine 102, a write control system 103, a read control system 104, and one or more memory arrays illustrated, for example, as a read/write memory array 106 and a read-only memory array 107. The test engine 102 can support such operations as DAT, built-in-self test (BIST), and individual diagnostic accesses. The write control system 103 governs writing test and diagnostic patterns into the memory array 106. The read control system 104 governs reading test and diagnostic patterns from the memory arrays 106 and 107.

Although the memory test system 100 can be implemented according to a variety of specifications, for purposes of illustration, the memory test system 100 is described using a 1056-bit wide array for the read/write memory array 106 (which includes 1024 bits of data and 32 bits of parity protection), a 256-bit wide read-only memory array 107, 32-bit wide dump buses (not shown), and a 16-bit wide path 113 to the test engine 102. The test engine 102 automatically sequences through every segment of the memory array 106 and reads from and writes to each segment. In one example implementation, the test engine 102 generates a 1056-bit testing pattern to write to the 1056-bit wide memory array 106. For testing purposes, all 1056 bits are tested as a unit. The testing pattern can be generated in 32-bit slices. Note that simpler testing patterns (e.g., 8-bits or 16-bits) could also be used by replicating their data patterns within the 32-bit slices. The 32-bit test pattern is replicated 32 times (for the data) and an 8-bit subset of the test pattern is replicated four times for the parity bits.

In response to a read request by the test engine 102, 1056 bits of data in the memory array 106, or 256 bits of data from the memory array 107, is provided over a 16-bit wide data path 113. Connection 114 between the read control system 104 and the read/write memory array 106 and connection 115 between the read control system 104 and the read-only memory array 107 each can be the full width of the respective memory array due to the proximity to the read control system 104. Connection 113 has a bus width that is minimized.

FIG. 2 is a schematic diagram that illustrates an embodiment of the read control system 104 shown in FIG. 1. With continued reference to FIG. 1, the test engine 102 accesses the 1056-bit wide data in the memory array 106 in 64-bit slices via connection 114. As an overview, the read control system 104 subdivides that data into 64-bit slices. For diagnostic reads, the 64 bits are split, with 32 bits being driven onto a true dump bus (e.g., true local dump bus 270 as described below) and 32 bits being driven onto a complement dump bus (e.g., complement local dump bus 274, as described below). In such a diagnose or diagnostic read mode, each of the 64 bits of one particular slice can be individually read out of the read control system 104. For DAT reads, both groups of 32 bits are driven onto both the true and complement dump buses. Note that the data source drives 1056 bits into the logic of the read control system 104, and the manner the bits are wired into various slices (and the way the various slices drive bits of the dump buses) determine the bit-groupings. In such a DAT read mode, each of the 1056 bits of data will drive a bit on either the true or complement dump bus, and data for all of the slices is thus merged. If it is assumed that every 32-bit slice contains the same data, then the true dump bus will have data on it that is the inverse of the data on the complement dump bus. As explained below, this is because a logical "1" bit will discharge its corresponding bit on the complement dump bus, whereas a logical "0" bit will discharge its corresponding bit on the true dump bus. If any slice contains an incorrect bit, then that bit will be discharged on both the true and complement dump buses. Thus, the errors can be identified by simply checking for any bit positions which have the same bit value on both the true and complement dynamic buses. The error indication can be accumulated over an entire DAT test sequence (i.e., once an error is detected, the error indication remains set), and then can be checked once at the end of the entire DAT test sequence. Thus, the read control system 104 uses the dump buses to compare the bit values between patterns written to and patterns read from a memory array, such as the memory array 106, and responsively provides the data read from a memory array and an error or mismatch bit.

Note that the size of the dump buses may depend on the width of the DAT test pattern that is replicated across the entire width of the memory array, for example memory array 106. Thus, the dump bus is a multiple of the DAT test pattern width. Using the example specifications described above, the 32-bit wide dump buses support 2-bit, 4-bit, 8-bit, 16-bit, and 32-bit DAT test patterns. This feature enables an additional factor of two reduction in the width of the test data read bus 113 since array reads can read once every other cycle. For example, during one ½-cycle, the read/write memory array 106 can be read, and the data can be provided to the test engine 102 via connection 113. During the next ½-cycle in which the read/write memory array 106 is idle, the other half of the data from the read can be sent to the test engine 102 via connection 113.

Referring in particular to FIG. 2, the read control system 104 includes data dumps 230a, 230b, 230c, 230d through 230n, and read-only memory (ROM) dumps 240a and 240b, with the dashed lines between data dumps 230d and 230n and beneath ROM dump 240b representing that additional dumps can be implemented. The data dumps 230a-230n receive data via connection 114, as described above, and receive diagnose control signals diag1, diag2, diag3, diag4, and diagn on connections 205a-205e, respectively. Further, data dumps 230a-230n receive DAT control signals on connection 207. Note the bus notations, such as "32/," which would be understood to convey the fact that each of the 32 bits of data requires its own set of gates (e.g., included in the data dump 230a). The connections 205a-205f and 207 are diag and DAT control signal lines that provide single signals that feed into the gates for all of the bits of the appropriate data bus. The diagnose and DAT control signals may be provided by selection logic (not shown). The ROM dumps 240a and 240b receive data on connection 115 and diagnose signals diag1b and diag2b on connections 205f and 205g, respectively. The selection logic receives control signals provided from one or more core areas of a microprocessor or from external control sources. Responsive to such control signals, the selection logic activates all of the diagnose signals 205a-205g as well as DAT signal(s) 207 during a DAT mode read from the data and parity memory array 106. For a diagnostic read of a particular 64-bit slice of either memory array 106 or 107, the selection logic activates only a single one of the diagnose signals 205a-205g.

The read control system 104 also includes true local dump buses 270 and 272 and complement local dump buses 274 and 276, corresponding to the data dumps 230a-230n. The read control system 104 further includes true local dump bus 273 and complement local dump bus 277 corresponding to ROM dumps 240a and 240b. Precharge devices, such as precharge device 259, pull all bits on the local dump buses 270-277 to their precharge state. Bits which are discharged on the local dump buses 270-277 discharge their corresponding bits on the global dump buses 278 and 279 via discharge devices 258a. Discharge devices 258a enable individual bits on the local dump buses 270-277 to be conditionally changed to their discharge state. A bit is put into the discharge state if one or more discharge devices 258a is enabled. In one implementation, where the local dump buses 270-277 are configured as dynamic buses, the precharge devices 259 are enabled only in the first clock phase, and the discharge devices 258a are enabled only during the second clock phase of a clock period. As mentioned above, static-configured dump buses can also be used.

The use of local dump buses 270-277 is an implementation detail used to reduce loading on any individual dump bus, and thus can be omitted in some embodiments. For instance, discharge devices (not shown) located in the data dumps 230a-230n and ROM dumps 240a, 240b may drive bits directly onto a single true or complement global dump bus. Alternatively, if there are relatively few local dump buses, these local dump buses could drive onto static global dump buses using OR gates, rather than using discharge devices to dump onto the wired-OR global dump buses 278 and 279. This alternative may require more wiring at the global level, but would retain the advantages described herein between slices at the local level. Each bit on the global dump buses 278 and 279 implicitly combines all of the bits which are enabled to drive it. A bit will be in the discharge state if any discharge device located in the data dumps or ROM dumps sets the corresponding bit to the discharge state.

Registers 296a and 296b capture and hold their input data from the global dump buses 278 and 279 when a memory array read is performed. For DAT testing, gates 297a and 297b detect array errors when any of the 32-bit slices differs from the others. A mismatch in any bit position causes one slice (which reads a logic 0 from the array) to discharge the true global dump bus 278, and another slice (which reads a logical 1 from the array) to discharge the complement global dump bus. Gate 297a checks each bit captured from the global dump buses 278 and 279 to detect if that bit position is discharged on both the true and complement global dump buses 278 and 279. Gate 297b combines those indications (e.g., signals that indicate a detection whether a bit position is discharged on both buses), signaling an error if any bit position is discharged on both the true and the complement dump buses. This error indication can either be saved locally or sent to the test engine 102 (FIG. 1). A multiplexer 299 drives the narrow test read data bus 113. In one embodiment, this test read data bus 113 may be half the size of each of the dump buses 270-279. For example, if the memory array 106 is read only on alternative clock cycles, multiplexer 299 can drive out half of the data stored in register 296a during the cycle immediately following the read; and it can drive the other half of the data in register 296a one cycle later. Following a diagnostic read, the multiplexer 299 can sequentially drive out all 64 bits of the data stored in registers 296a and 296b over four clock cycles, to provide the full 64 bits of data from the selected slice.

FIG. 3 is a schematic diagram that shows an exemplary architecture for a data dump, such as data dump 230a. The schematic diagram also serves to illustrate how operations on two 32-bit segments of the 1056-bit memory array 106 (FIG. 1) may be performed in one embodiment. Similar mechanisms may be employed for data dumps 230b-230n and ROM dumps 240a and 240b, with some differences noted below. The data dump 230a includes NAND gates 302, 304, 306, and 308 coupled to discharge devices 258a, 258a-1, 258a-2, and 258a-3, respectively.

With continued reference to FIG. 2, the selection logic provides a diagnose signal (e.g., diag1) on connection 205a, unique to data dump 230a, to enable the gates 302 and 308 during a DAT or diagnostic read. The gate 302 and discharge device 258a drive the first 32 bits of the 64-bit slice (from connection 114) onto the true local dump bus 270. If a data bit is a logical 0, the gate 302 enables the discharge device 258a to discharge the true local dump bus 270 (typically also represented by the logical 0 state). If the data bit is a logical 1, the gate 302 disables the discharge device 258a, and the true local dump bus retains its precharge state (the logical 1 state). Thus, the state of the true local dump bus 270 matches the state of the input data. Gate 308 and discharge device 258a-3 drive the second 32 bits of the 64-bit slice (from connection 114) onto the complement local dump bus 274. If the data bit is a logical 1, the gate 308 enables the discharge device 258a-3 to discharge the complement local dump bus 274 to the logical 0 state. If the data bit is a logical 0, the complement local dump bus 274 remains in the logical 1 state. Thus, the state of the complement bus is the inverse of the state of the input data.

During a diagnose read, only one diagnostic signal (e.g., diag1 on connection 205a) is enabled. Thus, only one slice of data is selected to be driven onto the true and complement dump buses 270 and 274. The first 32 bits appear un-inverted on the true local dump bus 270 and the second 32 bits appear inverted on the complement local dump bus 274. This 64-bit slice of data is discharged onto the global dump buses 278 and 279, captured by registers 296a and 296b, and later read out 16 bits at a time using multiplexer 299. The multiplexer 299 re-inverts the inverted data from the complement global dump bus 279, and thus the test data out bus 113 reads out the true data value that was stored in the memory array 106.

The selection logic also provides a DAT control signal on connection 207 to gates 304 and 306, which enables gates 304 and 306 only during a DAT read. Gate 304 and discharge device 258a-1 drive the inverse of the first 32bits of the 64-bit slice onto the complement local dump bus 274. Gate 306 and discharge device 258a-2 drive the value of the second 32 bits onto the true local dump bus 270.

In a DAT mode, all of the diagnostic signals and the DAT signal are enabled. Thus, all bits of all slices are enabled to drive onto both the true and the complement local dump buses 270 and 274. Within a single slice, each bit from data bus 114 discharges a bit on one of the true and complement local dump buses 270 and 274. If the bit is at a logical 0, it discharges its bit position on the true local dump bus 270. If the bit is at a logical 1, it discharges its bit position on the complement local dump bus 274. This is true for both the first 32-bit half and second 32-bit half of the 64-bit slice. Since DAT testing is expected to have written a replicated 32-bit pattern into the memory array 106, both 32-bit halves should be identical when read from the memory array 106 (assuming all of the memory cells are working properly). For example, if the least significant bit (LSB) of both 32-bit halves is logical 0, gates 302 and 306 discharge the LSB of the true local dump bus 270 (leaving the LSB on the complement local dump bus 274 precharged). Or, if the LSB is logical 1, gates 304 and 308 discharge the LSB of the complement local dump bus 274 (leaving the LSB on the true local dump bus 270 precharged). However, if the LSB of the first half is logical 0, but the LSB of the second half is logical 1, gate 302 discharges the LSB on the true local dump bus 270 and gate 308 discharges the LSB on the complement local dump bus 274.

Extending the above explanation, since all of the slices are enabled during DAT mode, if the LSB of any 32-bit half is logical 0 but the LSB of any other 32-bit half is logical 1, the LSB on both the true and complement local dump buses 270 and 274 are discharged (as are the corresponding global dump buses 278 and 279). This condition is tested for by gates 297a and 297b, and an error is reported if it is detected. If the LSB of all of the 32-bit halves is identical, then the LSB of only the true global dump bus 278 (if that bit was logical 0), or only the complement global dump bus 279 (if that bit was logical 1) will be discharged, and gate 297a will not fire. Gate 297b looks for errors on all 32 bit positions of the global dump buses 278 and 279, so that any mismatch on any bit of any slice is reported as an error.

For arrays which do not require DAT testing (e.g., ROM arrays), gates 304 and 306 can be omitted from the logic for their slices. Additionally, the width of the data bus from the memory array 106 does not need to be a multiple of the width of the dump buses 270-279. For example, a slice for data dump 230n receives only 8 bits of data input, uses only 8 sets of gates 302 and 304, drives only 8 bits of the dump buses 270 and 274, and requires no gates 306 and 308. In this, case, those 8 bits are factored into the comparison logic (i.e., AND gate 297a and OR gate 297b) normally, and this slice (for data dump 230n) does not affect the remaining 24 bits of the dump buses 270 and 274. Thus, the number of bits coming in on bus 114 does not need to be an even multiple of the width of the dump buses, nor to be evenly distributed onto the bits of the dump buses. For example, there exists four sets of 8 parity bits that can be treated independently. Four units of data dump logic accepts only 8 (instead of 64) bits of data, and drives only the low 8 bits of the true dump bus (instead of all 32 bits of both dump buses). The ability to have this asymmetry improves flexibility.

Note that the amount of comparison logic is determined by the width of each of the dump buses 270-279 (which is a function of the width of the DAT test pattern), and is completely independent of the width of the wide data source (e.g., the memory array 106). Thus, the comparison logic remains very simple (in the above described embodiment, only a 32-bit AND-OR tree). Data from multiple independent arrays can also be driven onto the dump buses 270-279, without complicating the comparison logic.

FIG. 4 is a schematic diagram that illustrates an embodiment of the read control system 104a as implemented at the transistor level. For purposes of illustration, the data dumps 230a-230d are discussed, with the understanding that similar principles apply to the ROM dumps 240a and 240b. In general, four dotted-line boxes 401, 403, 405, and 407 are shown, grouped by gate and discharge device functionality from each data dump 230a-230d. Thus, circuit 401 includes functionality corresponding to gate 302 as used in data dumps 230a-230d and related connections and components. Circuit 403 includes functionality corresponding to gate 306 as used in data dumps 230a-230d and related connections and components. Circuit 405 includes functionality corresponding to gate 308 as used in data dumps 230a-230d and related connections and components. Circuit 407 includes functionality corresponding to gate 304 as used in data dumps 230a-230d and related connections and components. Further, and as described in association with FIG. 3, circuit 401 corresponds to circuitry used to process the complement lower half (e.g., bits 0 to 31) of a plurality of identical 64-bit data slices. Circuit 403 corresponds to circuitry used to process the complement upper half (e.g., bits 32 to 63) of the plurality of identical 64-bit data slices. Circuit 405 corresponds to circuitry used to process the true upper half (e.g., bits 32 to 63) of the plurality of identical 64-bit data slices. Circuit 407 corresponds to circuitry used to process the true lower half (e.g., bits 0 to 31) of the plurality of identical 64-bit data slices.

With continued reference to FIGS. 2 and 3, circuits 401-407 each include a precharge device 259a, each configured as a field effect transistor (FET). In other words, all of the transistors 259a-259a-3 couple a clock signal nclk to circuits 401-407, respectively. The transistors 259a-259a-3 are enabled only during the first clock phase (e.g., nclk=0, or clk=1) of a period. All of the data inputs are the data bits from the bus 114 that pertain to each slice (e.g., each 64-bit slice). The control inputs, including the diagnose (e.g., diag1) and DAT inputs, are the same as those shown in FIG. 2. Note that these control inputs are to be asserted only during the second clock phase (e.g., clk=0) to avoid drive fights with the precharge devices 258a. The outputs include the dump buses such as true local dump bus 270 and complement local dump bus 274.

In circuit 401, the FET 259a is coupled to a parallel configuration of series configured transistors, such as transistors 402 and 404, corresponding to the functionality of the combination of the NAND gate 302 and discharge device 258a shown in FIG. 3 for each data dump 230a-230d. With reference to an exemplary data dump, such as data dump 230a, the transistor 402 receives inverted data bits corresponding to the slice data (e.g., data1) at its gate terminal, and transistor 404 receives diagnose signals (e.g., diag1). A similar configuration is shown for data dumps 230b-230d. In operation, the transistors 402 and 404 of each data dump 230a-230d pull the output (i.e., the true local dump bus 270) to the discharged state if the proper (i.e., diag1 corresponds to data1, the other diag control signals correspond to the other data slices) diagnose control signal is asserted and the corresponding (first half, 0:31) data bit is at logic 0.

Referring to circuit 403, the true local dump bus 270 is fed over a connection coupled with transistor 259a-1 and DAT transistor 406. Additional parallel-configured transistors of each data dump 230a-230d, such as transistor 408, are configured in series with the DAT transistor 406. Thus, transistors 406 and 408 comprise functionality corresponding to gate 306 and discharge device 258a-1 of the data dumps 230a-230d, and pull the output to the discharged state if the DAT control signal is asserted and the corresponding (second half, 32:63) data bit is at logic 0.

Circuit 405 includes transistor 259a-2 receptive to the clock signal nclk at its gate terminal. The transistor 259a-2 is coupled to a plurality of series-configured transistors, such as transistors 412 and 414, which correspond to functionality of the gate 308 and discharge devices 258a-2 of parallel arranged data dumps 230a-230d. The transistors 412 (receiving a data input) and 414 (receiving a diagnose signal input) discharge their output (which is the local complement dump bus 274) when they are enabled and the corresponding data bit is at logical 1.

Circuit 407 includes transistor 259a-3, which is configured to receive the clock signal nclk. The transistor 259a-3 and a transistor 416, the latter configured to receive a DAT signal, are coupled to the local complement dump bus 274. The transistor 416 is also coupled to a parallel-configured group of transistors, such as transistor 418, that receive data input. The transistors 416 and 418 comprise functionality corresponding to the gate 302 and discharge device 258a-3 of FIG. 3. The transistors 416 and 418 discharge their output (which is the local complement dump bus 274) when they are enabled and the corresponding data bit is at logic 1. Note that each column of transistors corresponding to functionality of gates 302-308 and discharge devices 258a-258a-3 (e.g., column comprising transistors for data dump 230a, column comprising transistors for data dump 230b, etc.) in this schematic diagram corresponds to a different data slice in FIG. 2.

In view of the above description, it will be appreciated that one read control method embodiment may comprise, as illustrated in FIG. 5, dividing data from a data source into defined slices (502), subdividing the defined slices into a first group and a second group (504), and driving the first group onto a first bus and the second group onto a second bus, the second bus providing data that is inverted as compared to the data on the first bus, the first bus and the second bus configured to provide wired-OR functionality (506).

Any process descriptions or blocks in the flow diagram of FIG. 5 should be understood as representing specific logical functions or steps in the process, and alternate implementations are included within the scope of the disclosure in which functions may be executed out of order from that shown or discussed, including substantially concurrently or in reverse order, depending on the functionality involved, as would be understood by those reasonably skilled in the art.

What is claimed is:

1. A read control method, comprising:
dividing data from a data source into defined slices;
subdividing the defined slices into a first group and a second group; and
driving the first group onto a first dynamic bus and the second group onto a second dynamic bus, the second dynamic bus providing data that is inverted as compared to data on the first dynamic bus, the first bus and the second dynamic bus configured to provide wired-OR functionality, wherein driving includes precharging at least one of the first bus and the second bus to its precharged state.

2. The method of claim 1, further including driving the first group onto the second dynamic bus and the second group onto the first dynamic bus.

3. The method of claim 2, further including comparing bit positions of data on the first dynamic bus with data on the second dynamic bus.

4. The method of claim 3, further including determining whether a logical value of the data at the compared bit positions is the same for the first dynamic bus as it is for the second dynamic bus.

5. The method of claim 4, further including detecting errors corresponding to faults in the wide data source where the logical value is the same.

6. The method of claim 5, further including providing at least one of an error indication and data read from the data source.

7. The method of claim 1, wherein driving the first group and the second group includes driving the first group onto a true local bus and driving the second group onto a complement local bus.

8. The method of claim 7, further including driving the first group onto the complement local bus and driving the second group onto the true local bus.

9. The method of claim 8, further including driving data corresponding to the first group onto at least one of a true global bus and a complement global bus and driving the second group onto at least one of a true global bus and a complement global bus.

10. The method of claim 9, further including comparing corresponding bit positions of the data on the true global bus and the complement global bus and determining logical values for the corresponding bit positions.

11. The method of claim 10, further including detecting when the logical values for the corresponding bit positions are equal, and responsive to that determination, providing an error indication.

12. The method of claim 1, wherein driving includes discharging at least one of the first bus and the second bus to its discharged state.

13. The method of claim 1, wherein the defined slices include multiple slices, and wherein the driving is implemented for the multiple slices in parallel.

14. A read control system, comprising:
dump logic coupled to a data source, said dump logic configured to receive a first group of a defined slice of data and a second group of the defined slice of data;
a true dump dynamic bus and a complement dump dynamic bus configured in a wired-OR arrangement, said dump logic configured to drive the first group of data onto the true dump dynamic bus and the second group of data onto the complement dump dynamic bus; and
a discharge device configured to discharge the true dump dynamic bus and the complement dump dynamic bus to a discharge state.

15. The system of claim 14, wherein the dump logic is further configured to drive the first group of data onto the complement dump dynamic bus and the second group of data onto the true dump dynamic bus.

16. The system of claim 15, further including comparison logic configured to compare bit positions of data on the true dump dynamic bus with data on the complement dump dynamic bus.

17. The system of claim 16, wherein the comparison logic is further configured to determine whether a logical value of the data at the compared bit positions is the same for the true dump dynamic bus as it is for the complement dump dynamic bus.

18. The system of claim 17, wherein the comparison logic is further configured to detect errors corresponding to faults in the wide data source where the logical value is the same.

19. The system of claim 18, wherein the comparison logic is further configured to provide an error indication.

20. The system of claim 14, wherein the dump logic is further configured to drive the first group onto the complement local dynamic bus and drive the second group onto the true local dynamic bus.

21. The system of claim 20, further including a true global dump bus and a complement global dump bus, each configured to receive at least one of data corresponding to the first group and data corresponding to the second group.

22. The system of claim 21, further including comparison logic configured to compare corresponding bit positions of the data on the true global bus and the complement global bus and determine logical values for the corresponding bit positions.

23. The system of claim 22, wherein the comparison logic is further configured to detect when the logical values for the corresponding bit positions are equal, and responsive to that determination, provide an error indication.

24. The system of claim 14, further including a multiplexer configured to provide data representative of the data from the data source on a data path that is a fraction of a data width of the data source.

25. The system of claim 24, wherein the multiplexer is further configured to provide the representative data corresponding in data width to each of the slices in a plurality of clock cycles.

26. The system of claim 14, further including a precharge device configured to pull the true dump dynamic bus and the complement dump dynamic bus to a precharge state.

27. The system of claim 14, wherein the wide data source includes at least one of a read/write memory array, a read-only memory array, and a data cache.

28. The system of claim 14, wherein the dump logic includes a logic gate and a discharge device.

29. A read control system, comprising:
means for dividing defined slices of data from a data source into a first group and a second group;
means for driving the first group onto a first dynamic bus and the second group onto a second dynamic bus, the second bus providing data that is inverted compared to the data on the first dynamic bus, the first dynamic bus and the second dynamic bus configured to provide wired-OR functionality; and
means for comparing data on the first dynamic bus and the second dynamic bus, wherein the means for comparing includes registers and logic gates.

30. The system of claim 29, further including means for driving the first group onto the second dynamic bus and driving the second group onto the first dynamic bus.

31. The system of claim 30, wherein the means for reading, dividing, and driving includes at least one of logic gates, a discharge device, and a precharge device.

32. The system of claim 29, further including means for indicating a fault in the data source.

33. The system of claim 32, wherein the means for indicating includes a logic gate.

* * * * *